(12) United States Patent
Dorn et al.

(10) Patent No.: US 9,853,562 B2
(45) Date of Patent: Dec. 26, 2017

(54) CONVERTER STATION WITH DIODE RECTIFIER

(71) Applicant: SIEMENS AKTIENGESELLSCHAFT, Munich (DE)

(72) Inventors: Joerg Dorn, Buttenheim (DE); Dominik Ergin, Baiersdorf (DE); Thomas Hammer, Schwabach (DE); Hans-Joachim Knaak, Erlangen (DE); Peter Menke, Oberfuellbach (DE); Roland Schuster, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 99 days.

(21) Appl. No.: 14/770,854

(22) PCT Filed: Feb. 28, 2013

(86) PCT No.: PCT/EP2013/054061
§ 371 (c)(1),
(2) Date: Aug. 27, 2015

(87) PCT Pub. No.: WO2014/131456
PCT Pub. Date: Sep. 4, 2014

(65) Prior Publication Data
US 2016/0013732 A1   Jan. 14, 2016

(51) Int. Cl.
*H02M 7/08* (2006.01)
*H02M 7/00* (2006.01)
*H02M 7/10* (2006.01)
*H02M 1/14* (2006.01)
*H02M 7/17* (2006.01)
*H05K 5/06* (2006.01)

(52) U.S. Cl.
CPC .............. *H02M 7/08* (2013.01); *H02M 1/143* (2013.01); *H02M 7/003* (2013.01); *H02M 7/106* (2013.01); *H02M 7/17* (2013.01); *H05K 5/067* (2013.01)

(58) Field of Classification Search
CPC ........ H02M 7/003; H02M 7/06; H02M 7/106; H02M 7/08; H02M 7/17; H02M 7/155; H02M 1/143
See application file for complete search history.

(56) References Cited

U.S. PATENT DOCUMENTS

| | | | |
|---|---|---|---|
| 4,441,150 A | 4/1984 | Albertinsky et al. | |
| 5,225,971 A * | 7/1993 | Spreen | H01F 30/10 336/184 |

(Continued)

FOREIGN PATENT DOCUMENTS

| | | |
|---|---|---|
| CN | 1365535 A | 8/2002 |
| CN | 102016301 A | 4/2011 |

(Continued)

*Primary Examiner* — Yusef Ahmed
(74) *Attorney, Agent, or Firm* — Laurence Greenberg; Werner Stemer; Ralph Locher

(57) ABSTRACT

A converter station for the transmission of electrical power has a diode rectifier with a DC terminal and an AC terminal. At least one transformer is connected to the AC terminal. In order to render the converter station as compact as possible, the diode rectifier is arranged in an insulating material.

5 Claims, 4 Drawing Sheets

(56) References Cited

U.S. PATENT DOCUMENTS

| | | | | |
|---|---|---|---|---|
| 6,067,236 | A * | 5/2000 | White | H02M 3/3374 323/266 |
| 6,597,593 | B1 * | 7/2003 | Cruz | G06F 1/26 257/E27.046 |
| 7,236,086 | B1 * | 6/2007 | Vinciarelli | H02M 3/33523 340/12.32 |
| 8,766,480 | B2 | 7/2014 | Hiller et al. | |
| 9,106,125 | B1 * | 8/2015 | Brandt | H02M 7/068 |
| 2002/0163818 | A1 * | 11/2002 | Green | H01F 27/2804 363/20 |
| 2004/0201221 | A1 * | 10/2004 | Moehlenkamp | F03D 7/0224 290/44 |
| 2006/0152085 | A1 * | 7/2006 | Flett | B60L 9/30 307/75 |
| 2008/0074074 | A1 * | 3/2008 | Skibinski | H02M 7/003 318/800 |
| 2009/0109713 | A1 * | 4/2009 | Schnetzka | H02M 7/003 363/34 |
| 2010/0195301 | A1 * | 8/2010 | Fotherby | H02M 7/003 361/775 |
| 2011/0241433 | A1 * | 10/2011 | Sihler | H02J 3/383 307/82 |
| 2012/0020463 | A1 * | 1/2012 | Cooley | H02M 7/003 378/101 |
| 2012/0057308 | A1 | 3/2012 | Sihler | |
| 2013/0343108 | A1 * | 12/2013 | Shepard | H05K 7/1432 363/123 |
| 2014/0029319 | A1 * | 1/2014 | Jochman | H05K 5/0213 363/67 |
| 2014/0104913 | A1 * | 4/2014 | Koyano | H02M 5/293 363/149 |
| 2014/0131843 | A1 * | 5/2014 | Balakrishnan | H01L 23/28 257/666 |
| 2014/0140119 | A1 * | 5/2014 | Shinohara | H02M 7/003 363/141 |
| 2014/0153303 | A1 * | 6/2014 | Potharaju | H02M 7/06 363/126 |
| 2014/0192578 | A1 * | 7/2014 | Koyano | H02M 5/293 363/149 |
| 2015/0263526 | A1 * | 9/2015 | Kjær | H02J 3/386 290/44 |
| 2016/0013653 | A1 * | 1/2016 | Dorn | H02M 7/003 363/35 |
| 2016/0254668 | A1 * | 9/2016 | Huang | H02J 3/34 307/64 |
| 2016/0315476 | A1 * | 10/2016 | Gomis | H02M 7/04 |
| 2016/0322924 | A1 * | 11/2016 | Oriol | H02P 9/105 |
| 2016/0359365 | A1 * | 12/2016 | Schroeder | H02J 3/36 |

FOREIGN PATENT DOCUMENTS

| | | |
|---|---|---|
| EP | 1198058 A1 | 4/2002 |
| WO | 2012030605 A1 | 3/2012 |
| WO | 2012175112 A1 | 12/2012 |

* cited by examiner

CONVERTER STATION WITH DIODE RECTIFIER

BACKGROUND OF THE INVENTION

Field of the Invention

The invention relates to a converter station for transmitting electrical power, with a converter, which has a DC-voltage connection and an AC-voltage connection, and with at least one transformer, which is connected to the AC-voltage connection, wherein the transformer and the converter are arranged in an insulating material.

A converter station such as this is known, for example, from the article by S. Bernal-Perez et al., "Wind power plant control for the connection to multiterminal HVdc links", IEEE, 2012, page 2873. That document discloses an installation in which a diode rectifier is connected on the DC voltage-side to a DC-voltage intermediate circuit. The DC-voltage intermediate circuit extends between two voltage source converters (VSC). The diode rectifier is connected to a wind farm via transformers and an AC-voltage grid. Furthermore, filter units, which are arranged on the AC voltage-side of the converter, are disclosed. On the DC voltage-side, a smoothing inductor is used to smooth the direct current generated by the diode rectifier.

A converter station with a thyristor rectifier is known from DE 2 316 327 A, which thyristor rectifier is arranged in an encapsulation housing filled with oil.

The connection of a wind farm erected in the sea to a supply grid on land can be done economically only with direct current in the case of large transmission paths. For this reason, in practice at the present time, a converter is accommodated on an open-sea platform which is erected in the vicinity of the wind farm in the sea. Said converter in the sea is connected via an AC-voltage grid to the wind farm, wherein a DC-voltage connection extends from the DC-voltage connection thereof to a converter on the land. The converters enable transmission of power in both directions. In order to start up the wind farm, a DC-voltage grid is generated by the converter in the sea, wherein the supply energy necessary for this can be drawn from the power supply grid on land. The wind turbines of the wind farm may therefore easily be synchronized to the existing AC-voltage grid. In the case of strong winds, the desired reversal of power flow, namely the power transmission from the wind farm to the power supply grid on land, takes place. At the present time, voltage source converters and self-commutated converters (VSCs) and, in particular, multi-level converters are used as converters. However, the erection of such converters in the sea is cost-intensive owing to the still high weight of the converters.

Therefore, it has already been proposed to use a diode rectifier in the sea instead of a self-commutated converter, which diode rectifier has only passive power semiconductors in the form of diodes. Although such a diode converter enables the power transport in only one direction, it has the advantage, however, that losses and the weight are significantly lowered in comparison with a self-commutated converter. Moreover, compact power semiconductors can be used.

The diode rectifier predetermines a fixed translation ratio between the DC voltage and AC voltage at its connections. Moreover, a diode rectifier generates harmonics both on its AC voltage-side and on its DC voltage-side. For this reason, the transformer mentioned at the outset is imperatively necessary. Said component makes the converter station mentioned at the outset heavy and bulky, however, with the result that high manufacturing costs occur, particularly in the case of use in the sea.

BRIEF SUMMARY OF THE INVENTION

The problem addressed by the invention is therefore to provide a converter station of the type mentioned at the outset which is as compact as possible.

This problem is solved within the context of the invention in that at least one encapsulation housing is provided in which at least a part of the converter and at least a part of the transformer are arranged together, wherein the common encapsulation housing is filled with the insulating material.

According to the invention, provision is made not only to arrange the transformer in an insulating material but also to arrange the converter in an insulating material, too. The term insulating material is intended to comprise, within the context of the invention, all gases, liquids and solids which have improved insulation properties compared to atmospheric air. Owing to the improved insulation properties, the individual components of the converter which are at different levels of electrical potential can be arranged at a shorter distance with respect to one another without voltage flashovers occurring. The converter is also arranged in an insulating material within the context of the invention. The insulating material must only be removed in the event of maintenance. For this purpose, for example, inlet and outlet means, via which the insulating material can escape or be poured in, are provided on an encapsulation housing in which the converter is arranged. The converter station according to the invention may have, for example, a converter which forms a six-pulse bridge with its current or voltage valves. One of the DC-voltage terminals of said six-pulse bridge is connected, for example, to the ground potential. The other DC-voltage terminal is then, for example, connected via a single-pole DC-voltage connection to a converter on the land. It is also possible to configure the converter as a twelve-pulse bridge known from high-voltage direct-current transmission. The twelve-pulse bridge has two six-pulse bridges which are connected in series on the DC voltage-side. The connection point thereof is generally at ground potential. Each six-pulse bridge is connected via a separate transformer to an AC-voltage grid. The windings of the two transformers are connected to one another in a different manner, with the result that a different phase shift occurs at the transformers. Of course, the converter station may also have two six-pulse bridges which each have one terminal at ground potential.

According to the invention, at least one encapsulation housing is provided in which at least a part of the converter and at least a part of the transformer are arranged together. The two components are arranged in the same insulating material. Of course, the optional wiring network of the converter is also housed in the encapsulation housing. The encapsulation housing is expediently at ground potential.

In the case of use of the converter station for connecting the wind farm, it may be advantageous if the transformer or transformers and the converter are arranged on different foundations.

Advantageously, at least one smoothing inductor is provided and is connected to the DC-voltage connection of the converter. The smoothing inductor suppresses harmonics on the DC voltage-side and thus smoothes the direct current.

Advantageously, at least a part of the smoothing inductor is arranged in the encapsulation housing. Accordingly, the converter, the transformer and the smoothing inductor are arranged in the same insulating material.

According to a preferred configuration of the invention, the converter and the transformer and, if necessary, a smoothing inductor are each arranged in an encapsulation housing, wherein the encapsulation housings are connected to one another. In this way, said components may be electrically connected to one another without elaborate bushings having to be used which transfer a conductor at a high-voltage potential from one insulating-material environment into another insulating-material environment or into an air atmosphere. The encapsulation, which is generally at ground potential, of the components of the converter station moreover protects said components against damaging environmental influences which may cause damage, in particular when the converter station is erected in the sea or in a lake.

The insulating material may, in principle, be gaseous, liquid or even solid. Expediently, the protective gases, such as sulfur hexafluoride or the like, known in energy transmission and distribution are used. However, particular advantages emerge if a liquid, for instance an expedient insulating oil, is used as insulating material. In addition to insulation, the oil provides cooling. Furthermore, it is expedient within the context of the invention that cooling means for cooling the insulating material are provided. The cooling means are arranged in or on the encapsulation housing.

The converter is expediently a thyristor rectifier or a diode rectifier. In particular, advantages emerge within the context of the invention if the converter is a diode rectifier. The diode rectifier has exclusively passive, that is to say non-actuable, power semiconductors which are light and cause few losses.

Expediently, the converter has a plurality of DC voltage-side series-connected or parallel-connected partial converters. Using said partial converters, the converter can be easily scaled and can thus easily be adapted to the respectively present current or voltage requirements. In addition, here, it is particularly advantageous within the context of the invention if the partial converters are partial diode rectifiers, which each consist exclusively of non-actuable power semiconductors in the form of diodes.

According to a further development which is expedient in relation hereto, each partial converter is connected on the AC voltage-side to a partial transformer, wherein said partial converter and said partial transformer are arranged in a common partial encapsulation housing. According to said expedient further development, components which are assigned, for example, to a string of a wind farm may be generated, wherein the string is connected to a number of wind turbines. The partial encapsulation housing may be arranged in the sea in a simple manner, for example on the foundation of a wind turbine. The converter station can thus be arranged in a distributed manner in the sea or in a lake, as a result of which the erection and hence the costs can be reduced even further.

Advantageously, a partial smoothing inductor is arranged in the partial encapsulation housing. The partial smoothing inductor is connected on the DC voltage-side to the partial converter. In this connection, it is expedient for the partial converter to be a partial diode rectifier.

Expediently, each partial converter has two DC-voltage terminals which can be bypassed by means of a bypass switch. According to said advantageous further development, for example in the event of a fault, a partial converter station, which comprises by way of example a partial diode rectifier, a partial transformer and a partial smoothing inductor, may be bypassed. If the partial converter station is connected to a section of a wind farm, for example to a string of a wind farm, said section may also be bypassed in this way. This is advantageous since the fault may be present both in the respective component and the string or branch of the AC-voltage grid connected to the component.

Expediently, a filter unit is provided on the AC voltage-side of the converter. The filter unit is used to compensate reactive power and to filter out harmonics of the fundamental harmonic, which occur during normal operation of the diode rectifier. The filter unit may also comprise wind turbines or consist exclusively of wind turbines.

Expediently, power supply means for supplying an AC-voltage grid connected to the converter station are provided. The power supply means cater to the circumstances in which a converter formed as a diode rectifier allows a power flow in only one direction. In the case of a wind-farm connection, to which the converter station according to the invention is particularly suited, it is often necessary, however, to supply the AC-voltage grid connected to the converter station with electrical power. By way of example, the wind turbines of the wind farm can be set up using said electrical energy and the rotor blades can be adjusted to the respectively required angle. The power supply means comprise, for example, a diesel engine which drives a generator, wherein the generator generates the required electrical power which is fed into the AC-voltage grid connected to the wind farm.

Advantageously, the power supply means are configured such that a diesel engine can be dispensed with, however, since the diesel engine requires a lot of maintenance and must be continuously supplied with diesel. In particular, in the event that the converter station according to the invention is situated in the sea, the fuel supply in the event of wind and storms is difficult. For this reason, within the context of the invention, it is expedient to provide power supply means with which the power can be supplied from a supply grid on land or an adjacent AC-voltage grid in the sea. Such power supply means comprise a power supply line which extends at least partially through the water and, for example, is an AC-voltage line with a voltage in the range from 50 to 70 kV.

According to a configuration of the invention which deviates therefrom, the power supply means comprise a partial converter which is connected in series on the DC voltage-side with the partial diode rectifiers of a diode rectifier. It is possible using the partial converter to use the DC-voltage connection through which the converter station is connected to the power supply grid on land to also supply the power flow in the opposite direction, that is to say from land to wind farm. In this connection, of course, it is expedient if the partial diode rectifiers, as mentioned above, are equipped with a bypass switch by means of which the bypassing of the partial diode rectifiers in the series circuit is enabled, with the result that the power from a converter on land is provided by the DC-voltage connection and can be converted from the partial converter or converters into AC voltage. The AC voltage that is thus generated is then used for the power supply of a connected wind farm.

Expediently, the transformer is connected to a switchgear assembly. The switchgear assembly is, for example, a gas-insulated switchgear assembly, wherein a corresponding bushing between the switchgear assembly and the transformer which is stored, for example, in oil is provided. As has already been mentioned above, within the context of the invention, it is also possible to use a plurality of transformers. This also applies to the switchgear assembly.

The switchgear assembly is expediently connectable via an AC-voltage line to a coupling-in component which is connected to a power supply grid on land or to an AC-voltage grid in the sea.

Further expedient configurations and advantages of the invention are the subject matter of the following description of exemplary embodiments of the invention with reference to the figures of the drawing, wherein identical reference signs refer to identically acting components and wherein

DESCRIPTION OF THE INVENTION

Figure 1:
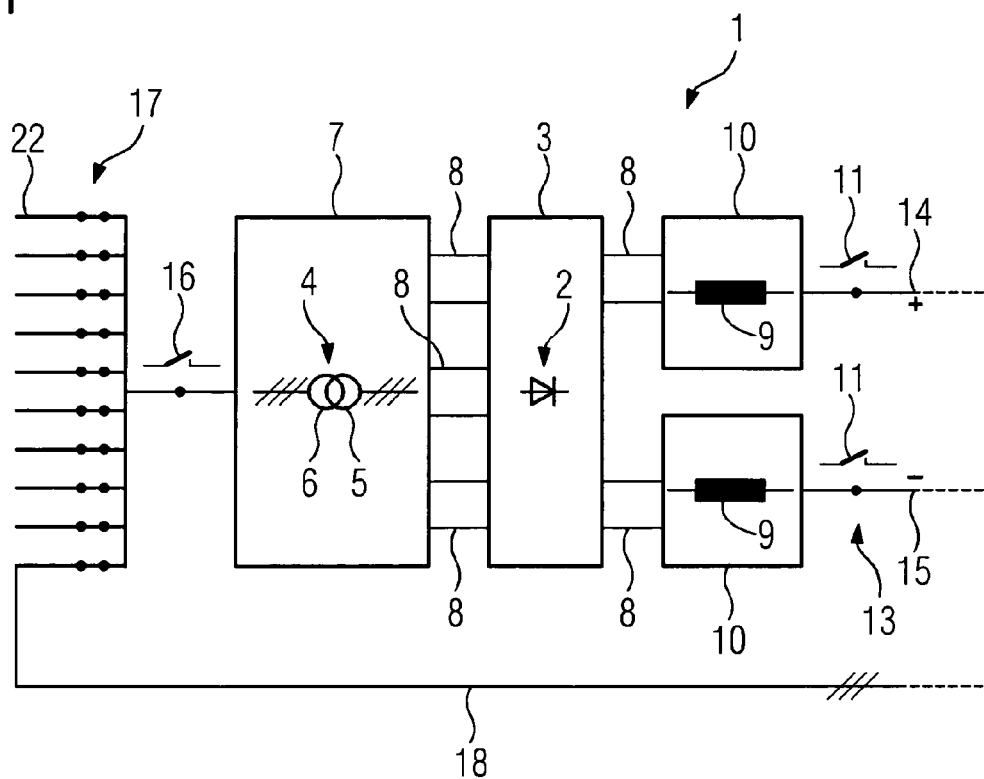
FIG. 1 schematically illustrates an exemplary embodiment of the converter station according to the invention FIG. 1a schematically illustrates the diode rectifier according to FIG. 1 in detail, FIG. 2 schematically illustrates a further exemplary embodiment of a converter station according to the invention, which connects a wind farm arranged in the sea to a converter on land, FIG. 3 schematically illustrates an exemplary embodiment of a partial converter station with partial diode rectifier, partial smoothing inductor and partial transformer in a common encapsulation housing, FIG. 4 schematically illustrates an exemplary embodiment of a partial converter with a partial transformer, and FIG. 5 schematically illustrates the partial converter station according to FIG. 3 in a lateral view.

FIG. 1 shows an exemplary embodiment of the converter station 1 according to the invention, which has a diode rectifier 2 which is arranged in an encapsulation housing 3 which is filled with an insulating material. In the exemplary embodiment shown in FIG. 1, the insulating material is an insulating oil. Moreover, the converter station 1 comprises a transformer 4, which has a primary winding 5 and a secondary winding 6, which are inductively coupled to one another. The transformer 4 is arranged in an encapsulation housing 7 which is filled with the same insulating oil. In order to feed the phase conductors of the AC voltage-side connection through between transformer 4 and converter 2, hollow-cylindrical supply pipes 8, which are likewise filled with the insulating oil, are used. The encapsulation housings 3, 7 are at ground potential.

Moreover, the converter station 1 has two smoothing inductors 9 which are each connected to one of the two DC-voltage connections of the diode rectifier 2. Each DC-voltage inductor 9 is arranged in a separate encapsulation housing 10, which is likewise filled with said insulating oil and is at ground potential. In order to feed the DC-voltage lines through between smoothing inductor 9 and the respective DC-voltage connection of the diode rectifier 2, supply pipes 8 are again used. In addition, mechanical switches 11 are provided, with which the converter station 1 can be connected at a DC-voltage connection 13 to the two DC-voltage poles 14 and 15. The transformer 4 is connected to a switchgear assembly 17 having a plurality of three-pole switches via an AC-voltage conductor 16, which switchgear assembly is realized as gas-insulated high-voltage switchgear assembly 17. One of the switches of the switchgear assembly 17 is connected to an AC-voltage line 18 which is connected as part of power supply means to a coupling-in component on land which is used to feed electrical power into the AC-voltage line 18. The coupling-in component is, by way of example, a transformer. The switchgear assembly 17 is connected to various strings 22 of an AC-voltage grid, wherein a plurality of wind turbines are connected to each string 22. Since the electrical power can be transferred only from wind farm to land using the diode rectifier 2, the energy must be transmitted via the AC-voltage line 18 in the other direction. Said AC-voltage line 18 has an AC voltage between 50 and 70 kV, which is expedient for this.

As can be seen in FIG. 1, the transformer 4, the diode rectifier 2 and the smoothing inductor 9 are arranged in the same insulating medium or insulating material, in this case in oil, with the result that the converter station 1 can be constructed in a more compact manner. The encapsulation housings 3, 7, 10 are all connected to one another. Instead of elaborate bushings, supply pipes 8 are used within the context of the invention and are likewise filled with insulating oil and through the center of which the respective high-voltage conductor extends.

Figure 1A:
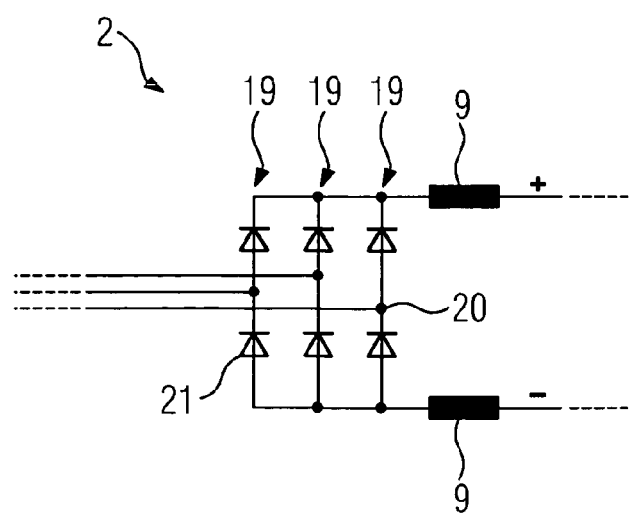

The construction of the diode rectifier 2 is illustrated in more detail in FIG. 1a. It can be seen that the diode rectifier 2 has three phase modules 19 the number of which corresponds to the number of phases of the AC-voltage grid to which the transformer 4 is connected. Each phase module 19 has two mutually oppositely polarizable DC-voltage connections or DC-voltage terminals, which are marked with a plus sign and minus sign. Furthermore, each phase module 19 has an AC-voltage connection 20. In each case, a diode valve 21 extends between the AC-voltage connection 20 and each of the DC-voltage connections, with the result that each phase module 19 has two diode valves 21. The diode valves 21 comprise a series circuit composed of diodes the number of which is in each case dependent on the present voltage. On the DC voltage-side of the diode rectifier, the smoothing inductors 9 are illustrated schematically and without encapsulation housing.

The diode rectifier illustrated in FIG. 1a forms a so-called six-pulse bridge, which is best known to a person skilled in the art in the field of high-voltage direct-current transmission. However, at this point it should be mentioned that the diode rectifier 2 may also have two such six-pulse bridges which are connected to one another on the DC voltage-side and are connected via various transformers to the same or to different sections or strings 22 of an AC-voltage grid. The transformers effect a different phase shift of the AC voltage transmitted thereby, with the result that a twelve-pulse bridge, which is likewise known per se, is provided. The connection line of the two six-pulse bridges is expediently grounded. Of course, each of the two six-pulse bridges may also be grounded at one of its DC-voltage terminals, independently of the other six-pulse bridge. Even if the diode rectifier forms only one six-pulse bridge, said six-pulse bridge can be connected at a DC-voltage terminal to the ground potential, with the result that a so-called monopole is formed.

Figure 2:
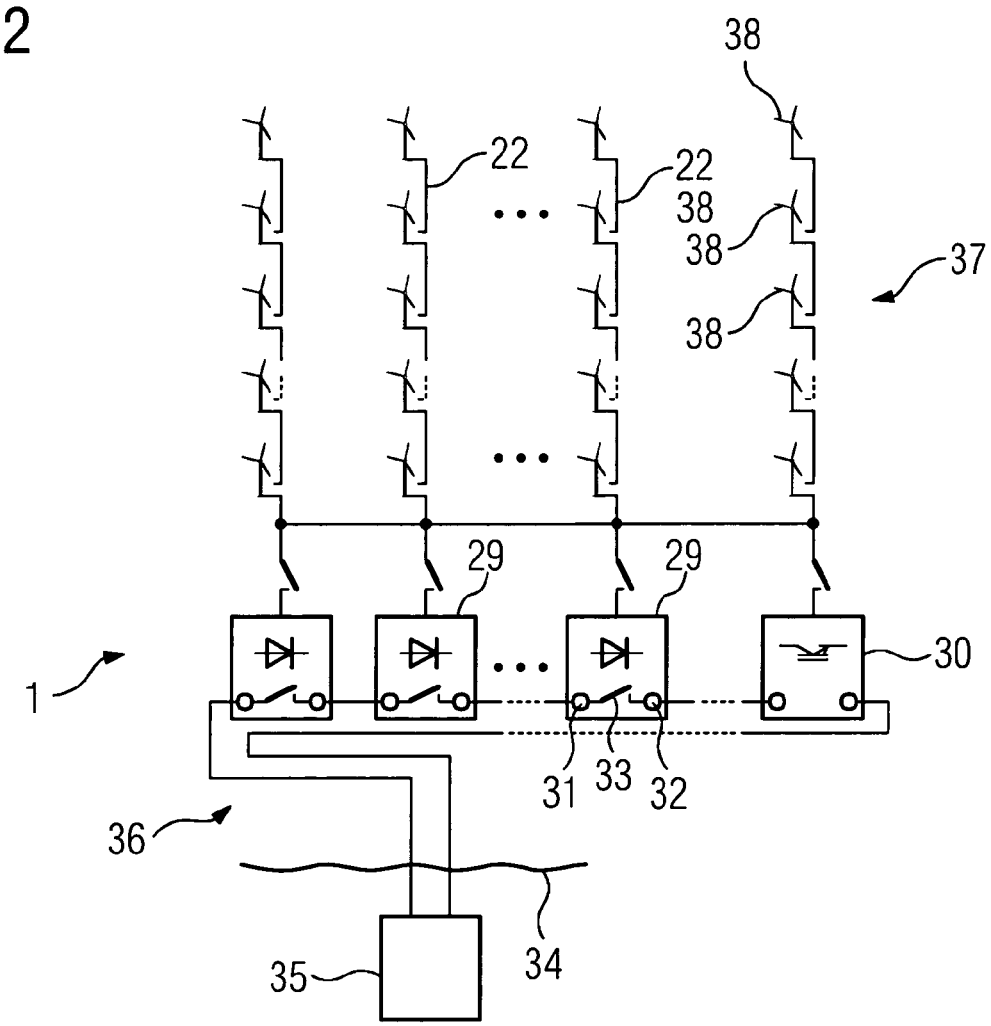

FIG. 2 shows another exemplary embodiment of the converter station 1 according to the invention, which is composed of partial converter stations 29, wherein each partial converter station 29 has a partial transformer which is not illustrated in the figures and a partial smoothing inductor which is likewise not illustrated in the figures. The partial converter stations 29 are connected to one another in series on the DC voltage-side. Moreover, a partial converter 30 can be seen in said series circuit. Each partial converter station 29 has a first DC-voltage connection terminal 31 and a second DC-voltage connection terminal 32, which may be connected to one another by means of a bypass switch 33. Thus, bypassing, for example, of a faulty partial converter station 29 is enabled by means of the bypass switch 33.

The converter station 1 is arranged on an open-sea platform, which is not illustrated in the figures, approximately 100 km from a coast 34 in the sea, wherein a converter 35 on land is connected via a DC-voltage connection 36 to the converter station 1. It can be seen that each partial converter station 29 is connected to a string 22 of a wind farm 37, wherein the wind farm 37 consists of a multiplicity of wind turbines 38.

Even in the event of no wind, the wind farm 37 requires energy. This is provided thereto using the partial converter 30. For this purpose, for example, all of the partial diode rectifiers 29 are bypassed by closing the respective bypass switch 33, with the result that the partial converter 30 is directly connected to the converter 35 on land, which is a modular multi-level converter, for example. Said modular multi-level converter is connected to a power supply grid which is not illustrated in the figures and feeds the necessary power into the partial converter 30, which provides said power on the AC voltage-side for the wind farm 37.

Figure 3:
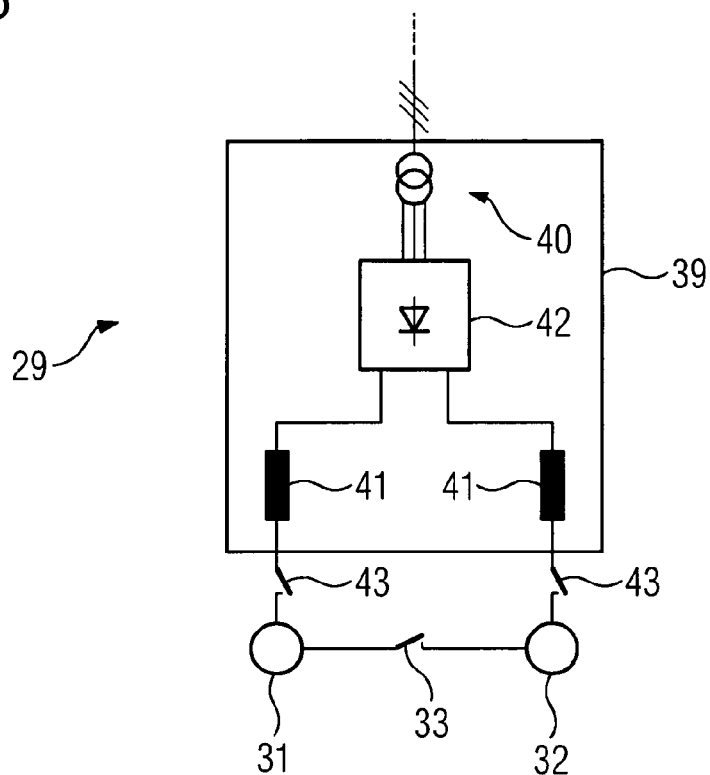

FIG. 3 shows the partial converter station 29 in more detail. It can be seen that the partial converter station 29 has a partial encapsulation housing 39 in which two partial smoothing inductors 41, a partial diode rectifier 42 and a partial transformer 40 are arranged together. The partial encapsulation housing 39 is filled with insulating oil. Outside of the partial encapsulation housing 39, mechanical DC-voltage switches 43 can be seen, by means of which the respective pole is connectable to the bypass switch 33.

Figure 4:
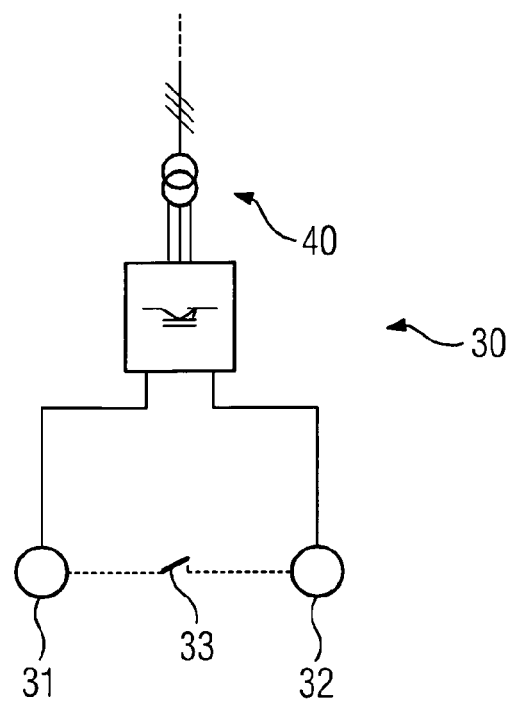

FIG. 4 shows the partial converter 30, which is not arranged in separate encapsulation housing, in more detail. The partial converter 30 does not have any smoothing inductors on the DC voltage-side. These are unnecessary in the case of a controlled or self-commutated partial converter. In addition, the partial converter 30 can be bypassed using a bypass switch 33 on the DC voltage-side.

Figure 5:
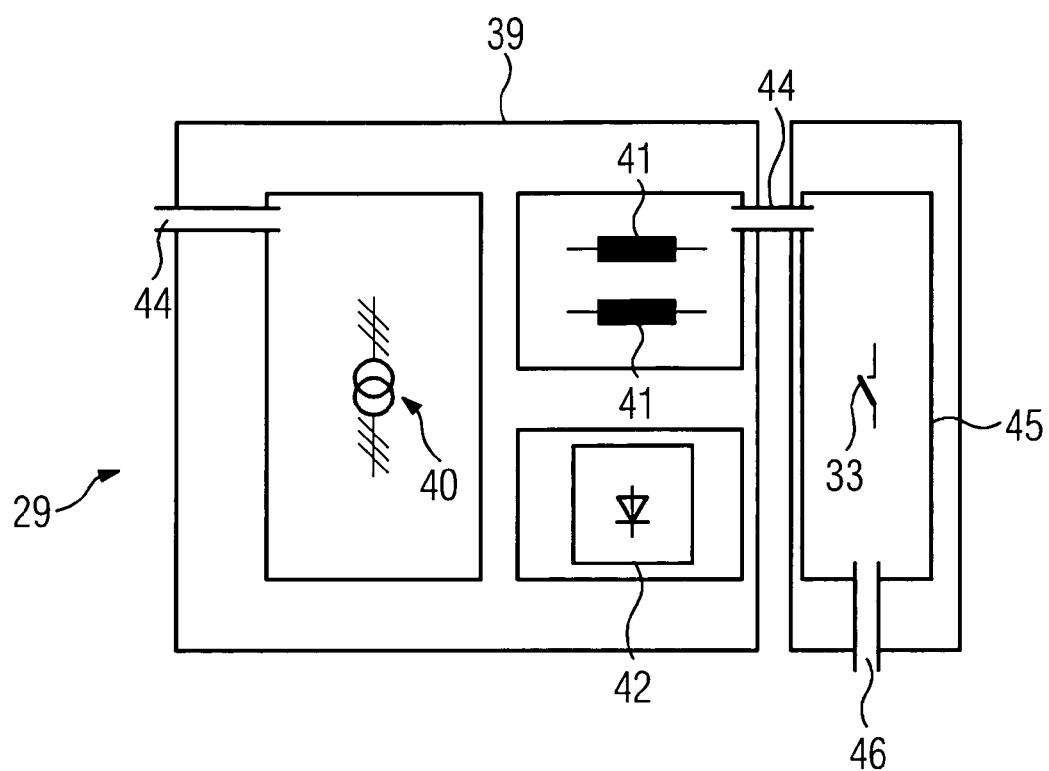

FIG. 5 shows a schematic lateral view of the partial converter station 29. It can be seen that the partial transformer 40, the partial smoothing inductors 41 and the partial diode rectifier 42 are arranged in a common encapsulation housing 39 which is filled with oil. Furthermore, bushings 44 can be seen with which high-voltage conductors are transferred from an oil insulation into a protective gas insulation, wherein they extend through one or more walls of the respective encapsulation housing, which walls are at ground potential. Moreover, it can be seen that the bypass switch 33 is likewise arranged in an encapsulation housing 45 which is filled, however, with a protective gas, in this case sulfur hexafluoride. The bushing 46 enables a cable to be connected to the housing 45 filled with protective gas.

The invention claimed is:

1. A converter station for transmission of electrical power, the converter station comprising:
   a converter having a DC-voltage connection and an AC-voltage connection;
   at least one transformer connected to said AC-voltage connection of said converter;
   at least one common encapsulation housing having at least a part of said converter and at least a part of said transformer disposed therein in common;
   insulating material encasing said part of said transformer and said part of said converter, said common encapsulation housing being filled with said insulating material;
   at least one DC-voltage smoothing inductor connected to conduct direct current output at said DC-voltage connection of said converter, wherein at least a part of said smoothing inductor is arranged in said common encapsulation housing; and
   a power supply device for supplying an AC-voltage network with electrical power, the AC-voltage network being connected to said converter, and said converter including a partial converter connected in series on a DC voltage-side with partial diode rectifiers of said converter.

2. The converter station according to claim 1, wherein said insulating material is a protective gas or an insulating liquid.

3. The converter station according to claim 1, wherein said converter is a thyristor rectifier or a diode rectifier.

4. The converter station according to claim 1, wherein said partial converter has two DC-voltage terminals and a bypass switch configured to bridge said DC-voltage terminals.

5. A converter station for transmission of electrical power between a windfarm that is located at sea and a supply grid on land, the converter station comprising:
   a converter having a DC-voltage connection and an AC-voltage connection;
   at least one transformer connected to said AC-voltage connection of said converter;
   at least one common encapsulation housing having at least a part of said converter and at least a part of said transformer disposed therein in common;
   insulating material encasing said part of said transformer and said part of said converter, said common encapsulation housing being filled with said insulating material;
   energy supply means for supplying an AC-voltage network connected to the converter station with electrical power from a power supply grid on land or a neighboring AC-voltage grid at sea, or an AC-voltage line extending at least partly submerged in water;
   wherein the AC-voltage network connected to the converter station at sea has a plurality of wind energy generators connected thereto;
   said converter having a plurality of partial diode rectifiers connected in series at a DC voltage side thereof;
   a switchgear assembly connected to said at least one transformer and connectable to a coupling-in component via an AC-voltage line, the coupling-in component being connected to the power supply grid on land or to the neighboring AC-voltage grid at sea;
   wherein said converter further includes a controlled or selfcommutated partial converter which is connected in series with the plurality of partial diode rectifiers at the DC voltage side.

* * * * *